United States Patent
Chuang et al.

(10) Patent No.: US 12,068,313 B2
(45) Date of Patent: Aug. 20, 2024

(54) SEMICONDUCTOR ARRANGEMENT AND FORMATION THEREOF

(71) Applicant: TAIWAN SEMICONDUCTOR MANUFACTURING COMPANY LIMITED, Hsin-Chu (TW)

(72) Inventors: Harry-Hak-Lay Chuang, Zhubei (TW); Wei Cheng Wu, Zhubei (TW); Shih-Chang Liu, Alian Township (TW); Ming Chyi Liu, Hsinchu (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 689 days.

(21) Appl. No.: 16/995,538

(22) Filed: Aug. 17, 2020

(65) Prior Publication Data

US 2020/0381423 A1    Dec. 3, 2020

Related U.S. Application Data

(60) Continuation of application No. 15/611,989, filed on Jun. 2, 2017, now Pat. No. 10,748,895, which is a
(Continued)

(51) Int. Cl.
*H01L 27/088*    (2006.01)
*H01L 21/28*    (2006.01)
*H01L 21/762*    (2006.01)
*H01L 21/8234*    (2006.01)
*H01L 27/11521*    (2017.01)
(Continued)

(52) U.S. Cl.
CPC ...... *H01L 27/088* (2013.01); *H01L 21/76224* (2013.01); *H01L 21/823418* (2013.01); *H01L 21/823481* (2013.01); *H01L 29/40114* (2019.08); *H01L 29/66825* (2013.01); *H01L 29/7883* (2013.01); *H10B 41/30* (2023.02); *H01L 29/6656* (2013.01)

(58) Field of Classification Search
None
See application file for complete search history.

(56) References Cited

U.S. PATENT DOCUMENTS 5,494,838 A * 2/1996 Chang ............... H01L 29/42328
                                                257/E27.103
5,656,861 A * 8/1997 Godinho ........... H01L 21/76897
                                                257/E21.507
(Continued)

*Primary Examiner* — Robert K Carpenter
(74) *Attorney, Agent, or Firm* — Cooper Legal Group, LLC

(57) ABSTRACT

A semiconductor arrangement and method of forming the same are described. A semiconductor arrangement includes a first gate structure on a first side of an active area and a second gate structure on a second side of the active area, where the first gate structure and the second gate structure share the active area. A method of forming the semiconductor arrangement includes forming a deep implant of the active area before forming the first gate structure, and then forming a shallow implant of the active area. Forming the deep implant prior to forming the first gate structure alleviates the need for an etching process that degrades the first gate structure. The first gate structure thus has a desired configuration and is able to be formed closer to other gate structures to enhance device density.

20 Claims, 9 Drawing Sheets

Related U.S. Application Data division of application No. 14/097,516, filed on Dec. 5, 2013, now Pat. No. 9,673,194.

(60) Provisional application No. 61/898,243, filed on Oct. 31, 2013.

(51) Int. Cl.
*H01L 29/66* (2006.01)
*H01L 29/788* (2006.01)
*H10B 41/30* (2023.01)

(56) References Cited

U.S. PATENT DOCUMENTS

| | | | |
|---|---|---|---|
| 6,359,807 B1* | 3/2002 | Ogura | H01L 27/11521 257/E27.103 |
| 6,624,024 B1* | 9/2003 | Prall | H01L 21/76831 257/E21.507 |
| 6,972,456 B2* | 12/2005 | Inoue | H01L 27/115 257/E21.679 |
| 7,718,488 B2* | 5/2010 | Chen | H01L 27/115 438/257 |
| 7,884,030 B1* | 2/2011 | Nickel | H01L 21/76224 257/E21.247 |
| 2006/0163642 A1* | 7/2006 | Widdershoven | G11C 16/0458 257/315 |
| 2008/0012062 A1* | 1/2008 | Yoo | H01L 27/11524 438/257 |
| 2011/0133292 A1* | 6/2011 | Lee | H01L 29/66795 257/401 |
| 2011/0147812 A1* | 6/2011 | Steigerwald | H01L 29/785 257/E21.409 |
| 2011/0223736 A1* | 9/2011 | Lin | H01L 29/66795 438/305 |
| 2012/0175696 A1* | 7/2012 | Franzon | H01L 29/66825 438/257 |
| 2013/0270501 A1* | 10/2013 | Toh | H01L 45/1666 257/E47.001 |
| 2013/0320452 A1* | 12/2013 | Wann | H01L 21/76897 257/E21.409 |
| 2014/0242796 A1* | 8/2014 | Toba | H01L 27/1157 438/682 |

* cited by examiner

SEMICONDUCTOR ARRANGEMENT AND FORMATION THEREOF

RELATED APPLICATIONS

This application is a continuation application of and claims priority to U.S. Non-Provisional application Ser. No. 15/611,989, titled "SEMICONDUCTOR ARRANGEMENT AND FORMATION THEREOF" and filed on Jun. 2, 2017, which is a divisional application of and claims priority to U.S. Non-Provisional application Ser. No. 14/097,516, titled "SEMICONDUCTOR ARRANGEMENT AND FORMATION THEREOF" and filed on Dec. 5, 2013, which claims priority to U.S. Provisional Application 61/898,243, titled "SEMICONDUCTOR ARRANGEMENT AND FORMATION THEREOF" and filed on Oct. 31, 2013. U.S. Non-Provisional application Ser. Nos. 15/611,989 and 14/097,516 and U.S. Provisional Application 61/898,243 are incorporated herein by reference.

BACKGROUND

A semiconductor arrangement comprises one or more semiconductor devices. A transistor is one type of semiconductor device. Generally, a current flows through a channel of the transistor between a source and a drain of the transistor when a sufficient bias or voltage is applied to a gate of the transistor. The transistor is generally regarded as being in an "on state" when current is flowing through the channel and in an "off state" when current is not flowing through the channel.

DETAILED DESCRIPTION

Figure 1:
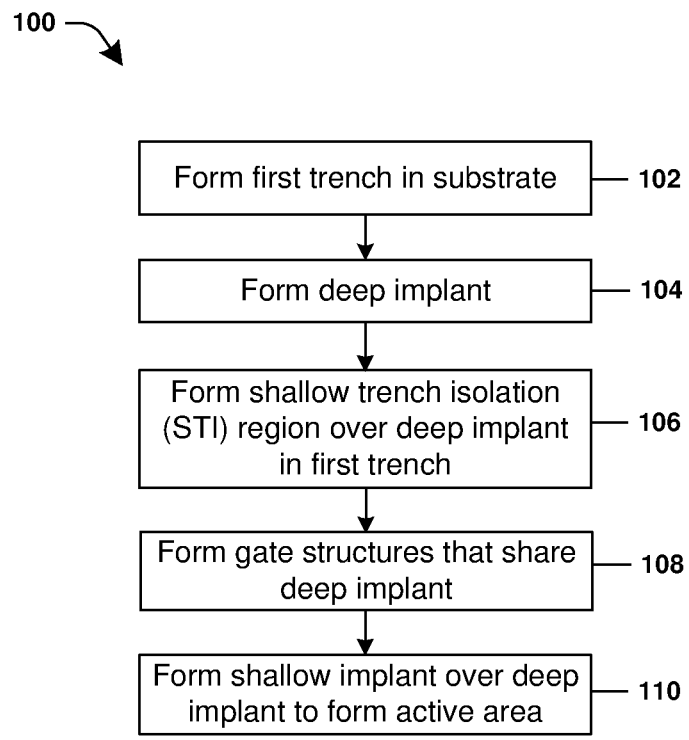
FIG. 1 is a flow diagram illustrating a method of forming a semiconductor arrangement, according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter may be practiced without these specific details. In other instances, structures and devices are illustrated in block diagram form in order to facilitate describing the claimed subject matter.

According to some embodiments, a method of forming a semiconductor arrangement comprises forming a first trench in a substrate and forming a deep implant in the first trench. In some embodiments, a first gate structure is formed on a first side of the deep implant and on a first side of the first trench and a second gate structure is formed on a second side of the deep implant and on the first side of the first trench. In some embodiments, a third gate structure is formed on the first side of the deep implant and on a second side of the first trench, and a fourth gate structure is formed on the second side of the deep implant and on the second side of the first trench. In some embodiments, a shallow trench isolation (STI) region is formed in the first trench. In some embodiments, a shallow implant is formed over the deep implant to form an active area. In some embodiments, the active area is at least one of a source or a drain. Forming the deep implant prior to forming the gate structures circumvents an etching process that degrades gate structures, according to some embodiments. Where the deep implant is formed after the gate structures are formed and thus the etching process is performed to form the deep implant, a distance between the first gate structure and the second gate structure is increased to mitigate the degradation to the gate structures. However, an area penalty is incurred by the increased distance. Because the etching process is not performed when the deep implant is formed prior to forming the gate structures, the distance between the first gate structure and the second gate structure is decreased. Forming the deep implant prior to forming the gate structures thus increases device density by allowing gate structures to be formed closer to one another while promoting desired gate structure configuration and performance by not exposing the gate structures to a potentially degrading etching process.

According to some embodiments, a semiconductor arrangement comprises a first gate structure on a first side of an active area and a second gate structure on a second side of the active area, the first gate structure and the second gate structure sharing the active region. According to some embodiments, the first gate structure comprises a first spacer on a first side of a first gate and a substantially identical second spacer on a second side of the first gate. According to some embodiments, the active area comprises at least one of a deep implant or a shallow implant. In some embodiments, a third gate structure is on the first side of the active area and a fourth gate structure is on the second side of the active area, such that the first gate structure, the second gate structure, the third gate structure and the fourth gate structure share the active area. In some embodiments, the active area is at least one of a source or a drain.

A method 100 of forming a semiconductor arrangement 200 according to some embodiments is illustrated in FIG. 1 and one or more structures formed thereby are illustrated in FIGS. 2-23. According to some embodiments, such as illustrated in FIG. 21, the semiconductor arrangement 200 comprises a first gate structure 228a on a first side 240a of an active area 249 and a second gate structure 228b on a second side 240b of the active area 249. According to some embodiments, the first gate structure 228a comprises a first spacer 230a on a first side 232a of a first gate 226a and a second spacer 230b on a second side 232b of the first gate 226a. According to some embodiments, a first spacer height 231a of the first spacer 230a is substantially equal to a second spacer height 231b of the second spacer 230b. According to some embodiments, one or more semiconductor arrangements 200 formed by method 100 have reduced area between adjacent gate structures, such as the first gate structure 228a and the second gate structures 228b, and comprise substantially symmetrical gate structures by avoiding etching to form a deep implant 208 of the active area 249. Moreover, forming the deep implant 208 without etching mitigates damage or degradation to gate structures otherwise incurred if etching is implemented to form the deep implant 208. The first spacer height 231a of the first spacer 230a being substantially equal to the second spacer height 231b of the second spacer 230b evidences a lack of damage to the first gate structure 228a and thus the formation of the first gate structure 228a after the deep implant 208 and the lack of etching to form the deep implant 208.

Figure 2:
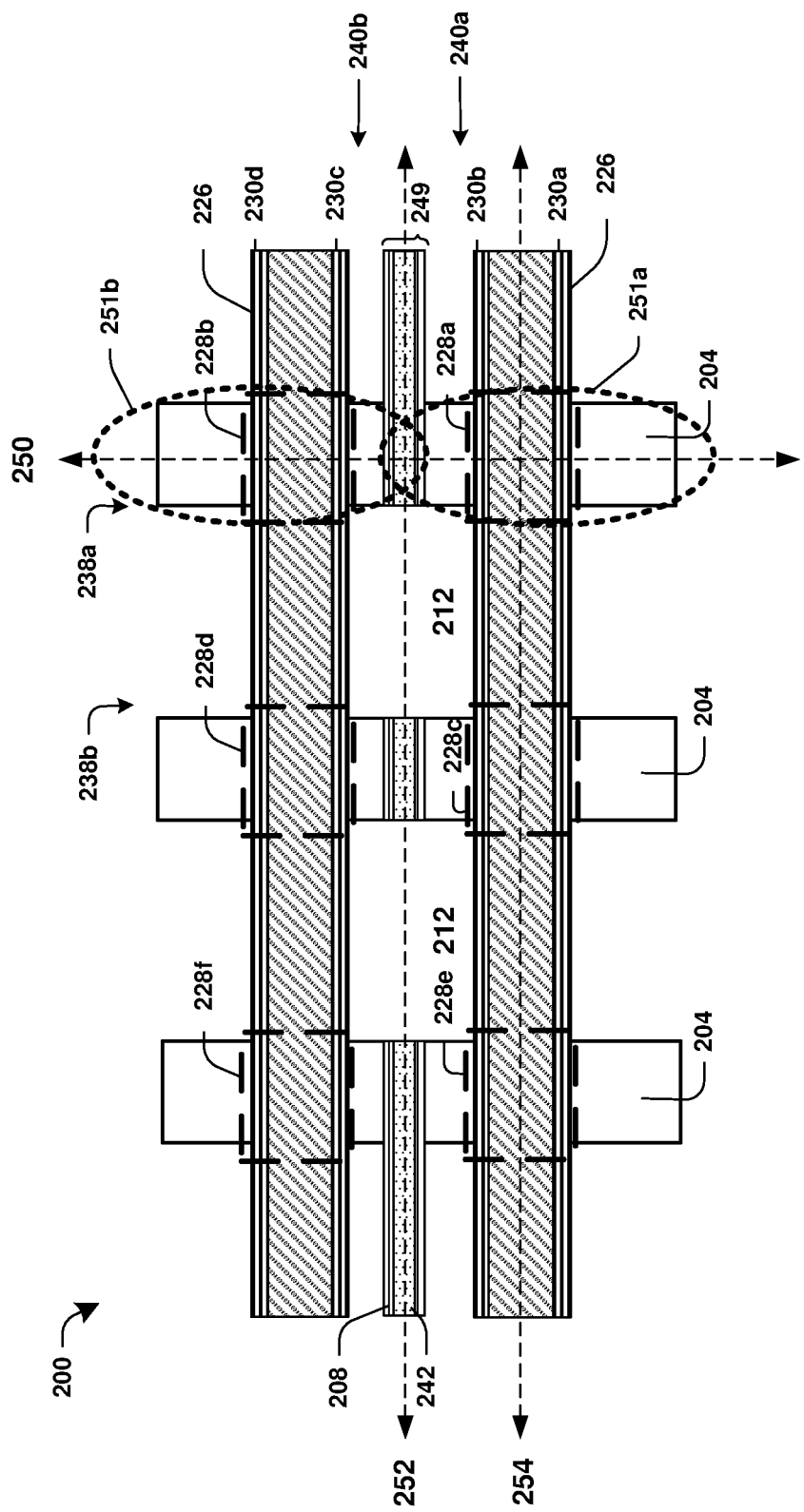
FIG. 2 is an illustration of a semiconductor arrangement, according to some embodiments.

Turning to FIG. 2 an overview or top down view of the semiconductor arrangement 200 is illustrated according to some embodiments, where a dielectric 246 illustrated in FIG. 21 is not shown in FIG. 2 so that features underlying the dielectric 246 are visible in FIG. 2. In FIG. 2 three lines 250, 252 and 254 are drawn to illustrate cross-sections that are depicted in other Figs. A first line 250 cuts through an OD region 204, the first gate structure 228a, and the second gate structure 228b, where the OD region 204 is a region where one or more active areas, such as at least one of a source or a drain, are formed in some embodiments. FIGS. 3, 6, 9, 12, 15, 18 and 21 are cross sectional views of the semiconductor arrangement 200 taken along the first line 250 at various stages of fabrication. A second line 252 cuts through the active area 249 and a STI region 212 over the active area 249. FIGS. 5, 8, 11, 14, 17, 20 and 23 are cross sectional views of the semiconductor arrangement 200 taken along the second line 252 at various stages of fabrication. A third line 254 cuts through the first gate structure 228a, a third gate structure 228c, and a fifth gate structure 228e. FIGS. 4, 7, 10, 13, 16, 19 and 22 are cross sectional views of the semiconductor arrangement 200 taken along the third line 254 at various stages of fabrication.

Figure 3:
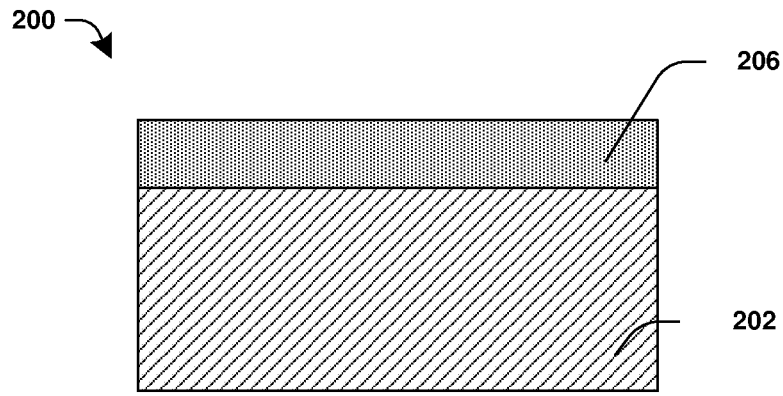
FIG. 3 is an illustration of a semiconductor arrangement, according to some embodiments.
Figure 4:
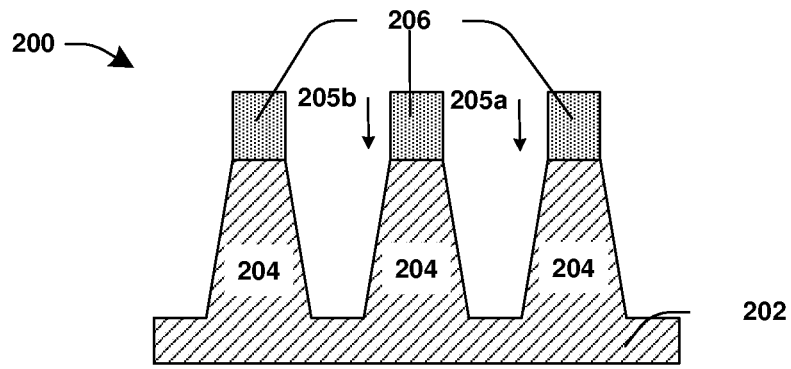
FIG. 4 is an illustration of a semiconductor arrangement, according to some embodiments.
Figure 5:
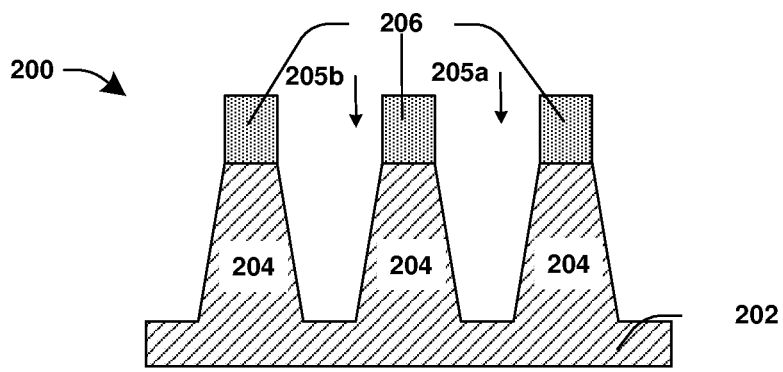
FIG. 5 is an illustration of a semiconductor arrangement, according to some embodiments.

At 102, a first trench 205a is formed in the substrate 202, as illustrated in FIGS. 3-5. In some embodiments, the substrate 202 comprises at least one of a silicon oxide or a silicon nitride. According to some embodiments, the substrate 202 comprises at least one of an epitaxial layer, a silicon-on-insulator (SOI) structure, a wafer, or a die formed from a wafer. In some embodiments, the first trench 205a is formed by patterning a first resist 206, such as a photoresist, over the substrate 202 and removing, such as by etching, portions of the substrate 202 not covered by the first resist 206. While the first trench 205a is discussed, other trenches such as 205b are formed as well, in some embodiments. Also, while trenches 205a and 205b are visible in FIGS. 4 and 5, the trenches 205a and 205b are not visible in FIG. 3 because FIG. 3 illustrates a cross section along line 250 of FIG. 2, where line 250 cuts through the OD region and the trenches are not formed in the OD region 204. The portion of the substrate 202 visible in FIG. 3 is thus covered by the first resist 206 in FIG. 3. In some embodiments, the patterned resist 206 is removed after the trenches 205 are formed.

Figure 6:
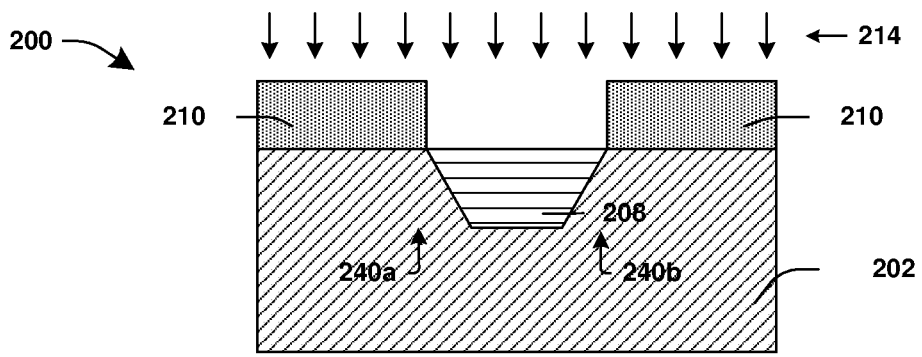
FIG. 6 is an illustration of a semiconductor arrangement, according to some embodiments.
Figure 7:
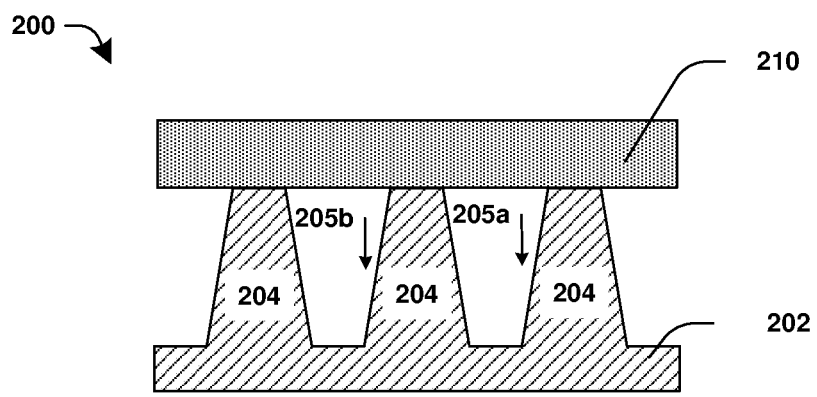
FIG. 7 is an illustration of a semiconductor arrangement, according to some embodiments.
Figure 8:
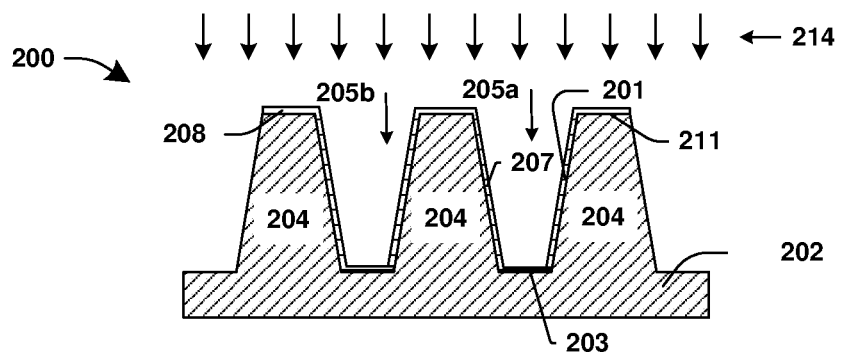
FIG. 8 is an illustration of a semiconductor arrangement, according to some embodiments.
Figure 9:
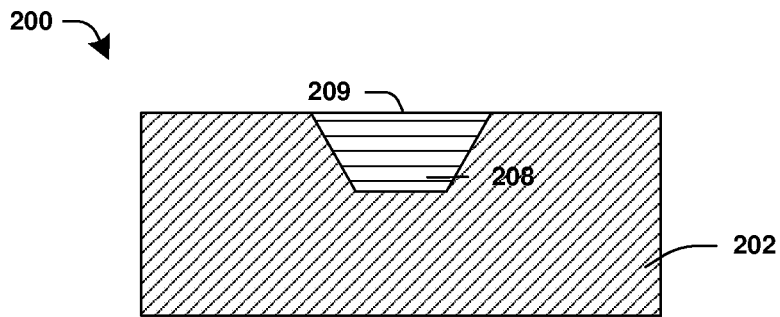
FIG. 9 is an illustration of a semiconductor arrangement, according to some embodiments.

At 104, a deep implant 208 is formed in the substrate 202, as illustrated in FIGS. 6-8. In some embodiments, the deep implant 208 is formed via deep implantation 214. In some embodiments, the deep implantation 214 comprises implanting a dose between about 1E03 atoms/cm$^2$ to about 1E07 atoms/cm$^2$ of a first dopant at an energy of between about 0.5 keV to about 4 keV. In some embodiments, the first dopant comprises at least one of nitrogen, phosphorus or arsenic. In some embodiments, the first dopant comprises at least one of boron, aluminum or gallium. In some embodiments, a second resist 210 is formed and patterned over the substrate 202 to a first side 240a and a second side 240b of a location where the deep implant 208 is to be formed, such that the deep implant 208 is merely formed within the substrate 202 at that location, as illustrated in FIG. 6. As illustrate in FIG. 7, the deep implant 208 is not formed in the substrate 202 in areas where gate structures 228 are to be formed and thus these areas of the substrate 202 are covered by the second resist 210. As illustrated in FIG. 8, the deep implant 208 is, however, in the substrate 202 on a first side 201 of the first trench, a bottom 203 of the first trench and a second side 207 of the first trench, as well as in similar areas in other trenches and on top surfaces 211 of the OD regions 204.

Figure 10:
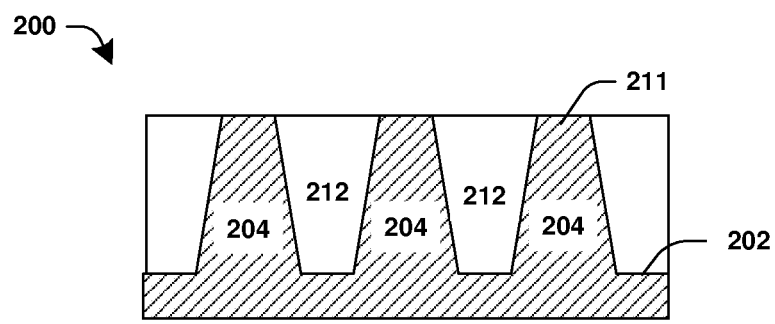
FIG. 10 is an illustration of a semiconductor arrangement, according to some embodiments.
Figure 11:
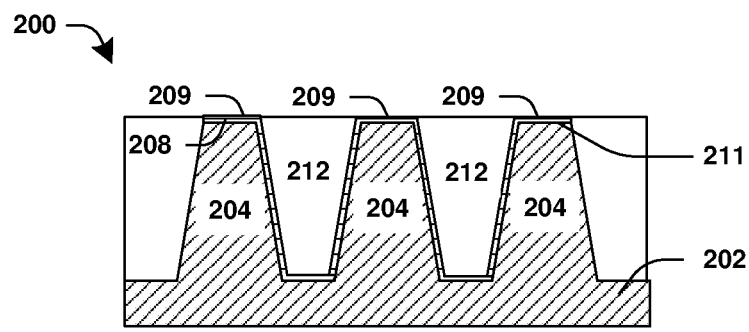
FIG. 11 is an illustration of a semiconductor arrangement, according to some embodiments.

At 106, a shallow trench isolation (STI) region 212 is formed over the deep implant 208 in the first trench 205a, as well as in other trenches, as illustrated in FIG. 11. As illustrated in FIG. 10, the STI region 212 is also formed in areas of the trenches 205 where the deep implant 208 is not formed. In some embodiments the STI region 212 is formed by filling the first trench 205a with a dielectric material, such as by deposition. In some embodiments, excess dielectric material is removed, such as by a chemical mechanic process (CMP), to form a substantially plainer surface. In some embodiments, a hard mask (not shown) is formed over the top surfaces 211 of the OD regions 204 to protect those surfaces 211 during such planarization processes.

Figure 12:
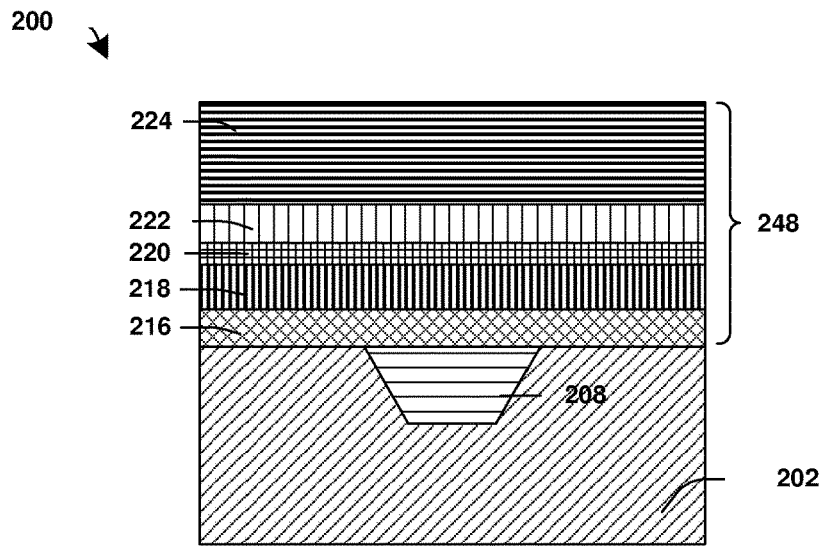
FIG. 12 is an illustration of a semiconductor arrangement, according to some embodiments.
Figure 13:
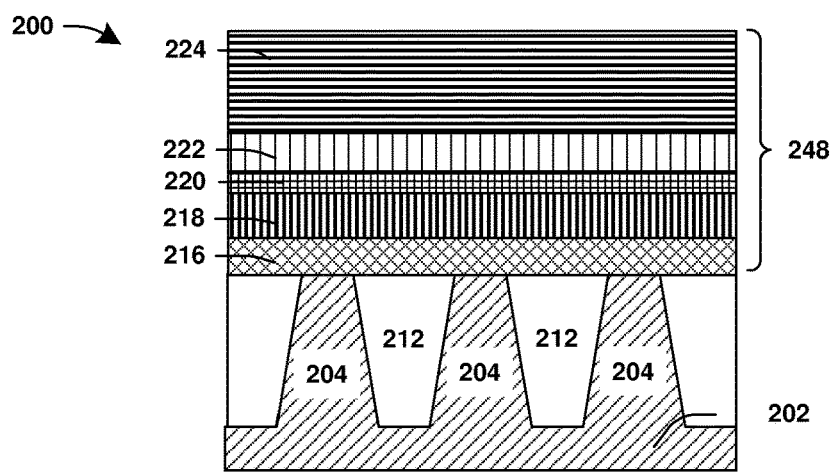
FIG. 13 is an illustration of a semiconductor arrangement, according to some embodiments.
Figure 14:
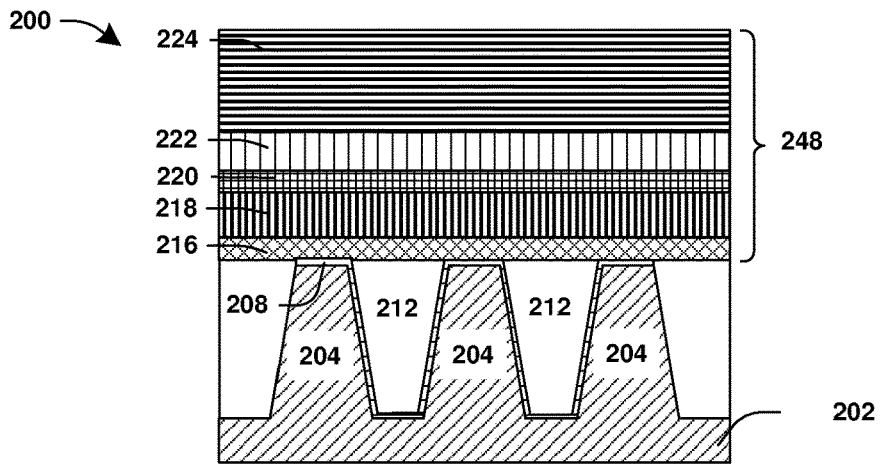
FIG. 14 is an illustration of a semiconductor arrangement, according to some embodiments.
Figure 15:
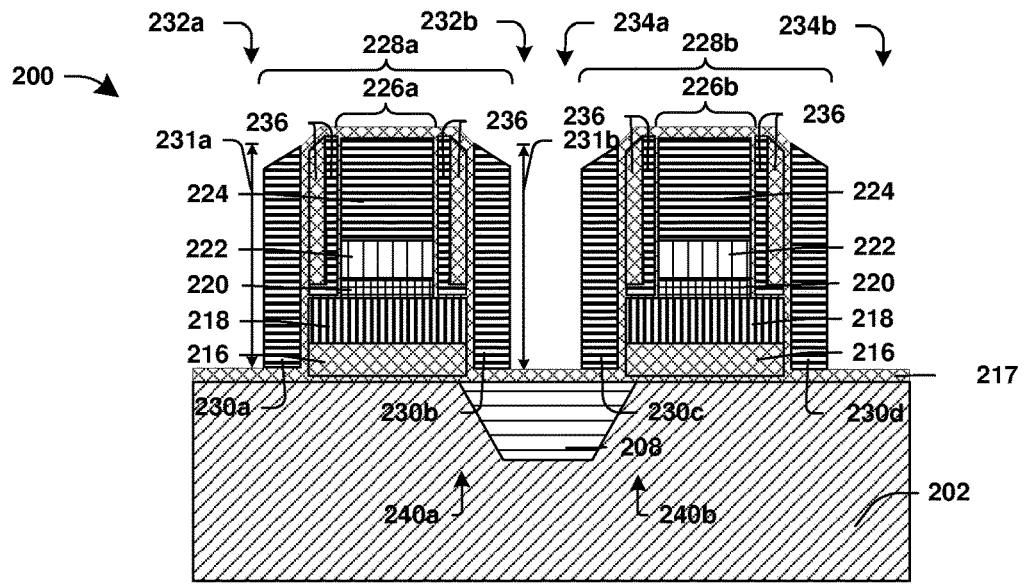
FIG. 15 is an illustration of a semiconductor arrangement, according to some embodiments.

At 108, as illustrated in FIGS. 2 and 15-17 a first gate structure 228a is formed on the first side 240a of the deep implant 208 and on a first side 238a of the STI region 212, a second gate structure 228b is formed on a second side 240b of the deep implant 208 and on the first side 238a of the STI region 212, a third gate structure 228c is formed on the first side 240a of the deep implant 208 and on a second side 238b of the STI region 212, and a fourth gate structure 228d is formed on the second side 240b of the deep implant 208 and the second side 238b of the STI region 212. According to some embodiments, additional gate structures, such as 228e, 228f, etc., are formed in a like manner. Turning to FIGS. 12-14, formation of such gate structures 228 comprises forming a gate material stack 248 over the substrate 202 and the STI regions 212, according to some embodiments. In some embodiments, the gate material stack 248 comprises a hard mask 224 formed over a control gate 222, the control gate 222 formed over a sandwich 220, the sandwich 220 formed over a floating gate 218, and the floating gate 218 formed over a gate oxide 216. In some embodiments, the gate oxide 216 comprises silicon oxide. In some embodiments, the gate oxide 216 has a height between about 50 Å to about 150 Å. In some embodiments, the gate oxide 216 is formed by deposition. In some embodiments, the floating gate 218 comprises at least one of a metal or a polysilicon. In some embodiments, the floating gate 218 has a height between about 150 Å to about 350 Å. In some embodiments, the floating gate 218 is formed by deposition. In some embodiments, the sandwich 220 comprises an oxide layer over a nitride layer over an oxide layer. In some embodiments, the sandwich 220 has a height between about 10 Å to about 100 Å. In some embodiments, the sandwich 220 is formed by deposition. In some embodiments, the control gate 222 comprises at least one of a metal or a polysilicon. In some embodiments, the control gate 222 has a height between about 150 Å to about 350 Å. In some embodiments, the control gate 222 is formed by deposition. In some embodiments, the hard mask 224 comprises at least one of silicon or nitride. In some embodiments, the hard mask 224 has a height between about 650 Å to about 950 Å. In some embodiments, the hard mask 224 is formed by deposition.

According to some embodiments, the gate material stack 248 is patterned to form the first gate structure 228a on the first side 240a of the deep implant 208 and on the first side 238a of the STI region 212, the second gate structure 228b on the second side of the deep implant 208 and on the first side 238a of the STI region 212, the third gate structure 228c on the first side 240a of the deep implant 208 and on the second side 238b of the STI region 212, and the fourth gate structure 228d on the second side of the deep implant 208 and the second side 238b of the STI region 212, as illustrated in FIGS. 2, 15-17. According to some embodiments, additional gate structures, such as 228e, 228f, etc., are formed in like manner. In some embodiments, the first gate structure 228a comprises a first gate 226a, a first sidewall spacer 230a, a second sidewall spacer 230b, and additional spacers 236 that are formed after one or more patterning actions are applied to at least some of the gate material stack 248. In some embodiments, the second gate structure 228b comprises a second gate 226b, a third sidewall spacer 230c, a fourth sidewall spacer 230d, and additional spacers 236 that are formed after one or more patterning actions are applied to at least some of the gate material stack 248. In some embodiments, the gate material stack 248 is patterned to form the first gate 226a and the second gate 226b. In some embodiments, the sandwich 220, the control gate 222 and the hard mask 224 are patterned to have a lesser width than the gate oxide 216 and the floating gate 218. In some embodiments, additional spacers 236 are formed on a first side 232a of the first gate 226a, and a second side 232b of the first gate 226a such that the additional spacers 236 are adjacent the sandwich 220, the control gate 222 and the hard mask 224. In some embodiments, the additional spacers 236 are formed on a first side 234a of the second gate 226b, and a second side 234b of the second gate 226b such that the additional spacers 236 are adjacent the sandwich 220, the control gate 222 and the hard mask 224. In some embodiments, the additional spacers 236 comprise at least one of oxide or nitride. In some embodiments, the first sidewall spacer 230a is formed on the first side 232a of the first gate 226a having a first sidewall height 231a and the second sidewall spacer 230b is formed on the second side 232b of the first gate 226a having a second sidewall height 231b. In some embodiments, the first sidewall height 231a is substantially equal to the second sidewall height 231b. In some embodiments, the second sidewall spacer 230b is at least partially over the deep implant 208. In some embodiments, a third sidewall spacer 230c is formed on the first side 234a of the second gate 226b and a fourth sidewall spacer 230d is formed on the second side 234b of the second gate 226b. In some embodiments, the third sidewall spacer 230c is at least partially over the deep implant 208. In some embodiments, a dielectric layer 217 is formed before the sidewall spacers 230a, 230b, 230c, 230d are formed. In some embodiments, the third gate structure 228c, the fourth gate structure 228d and additional gate structures, such as 228e, 228f, etc., are similarly arranged.

Figure 16:
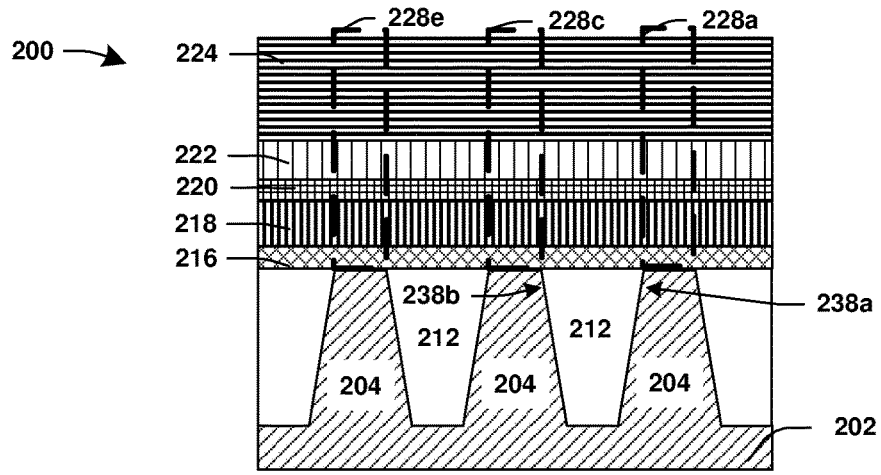
FIG. 16 is an illustration of a semiconductor arrangement, according to some embodiments.
Figure 17:
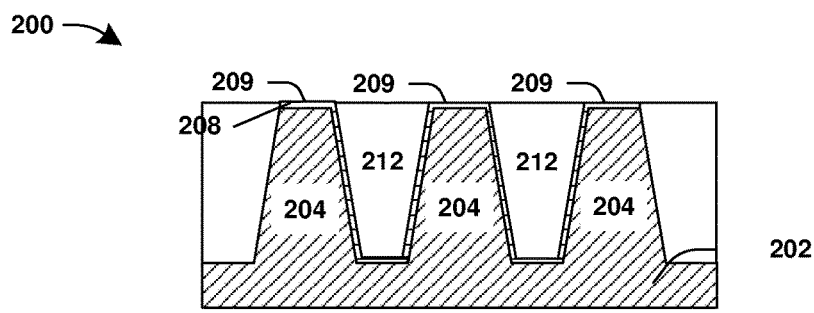
FIG. 17 is an illustration of a semiconductor arrangement, according to some embodiments.
Figure 18:
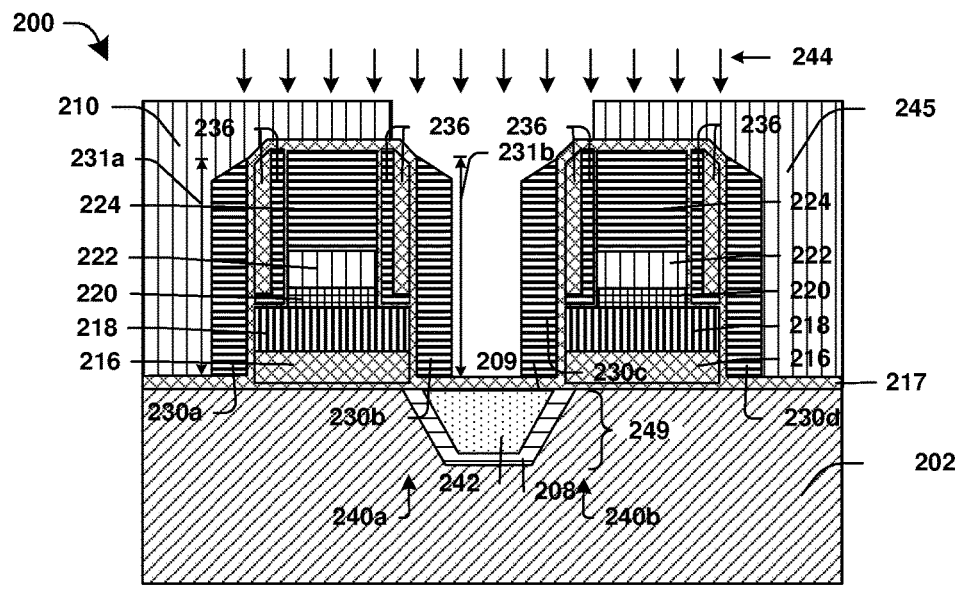
FIG. 18 is an illustration of a semiconductor arrangement, according to some embodiments.
Figure 19:
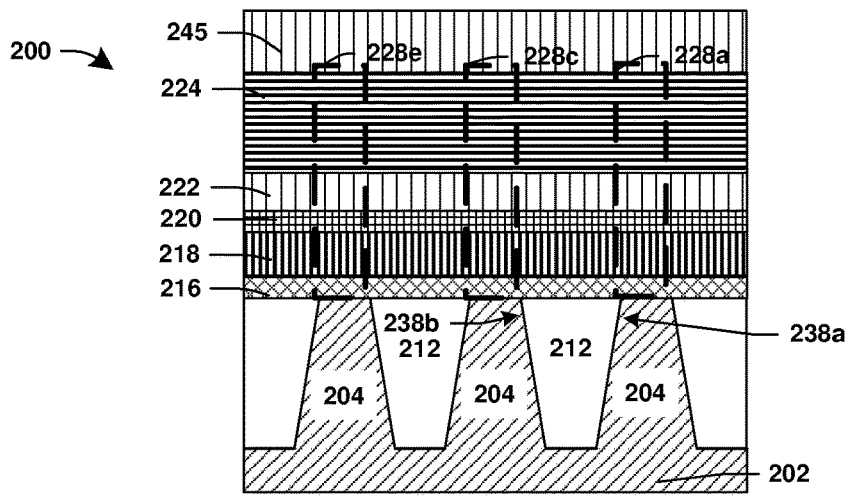
FIG. 19 is an illustration of a semiconductor arrangement, according to some embodiments.
Figure 20:
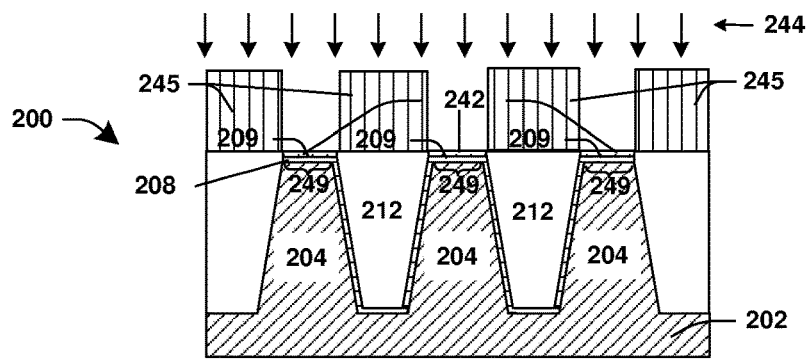
FIG. 20 is an illustration of a semiconductor arrangement, according to some embodiments.
Figure 21:
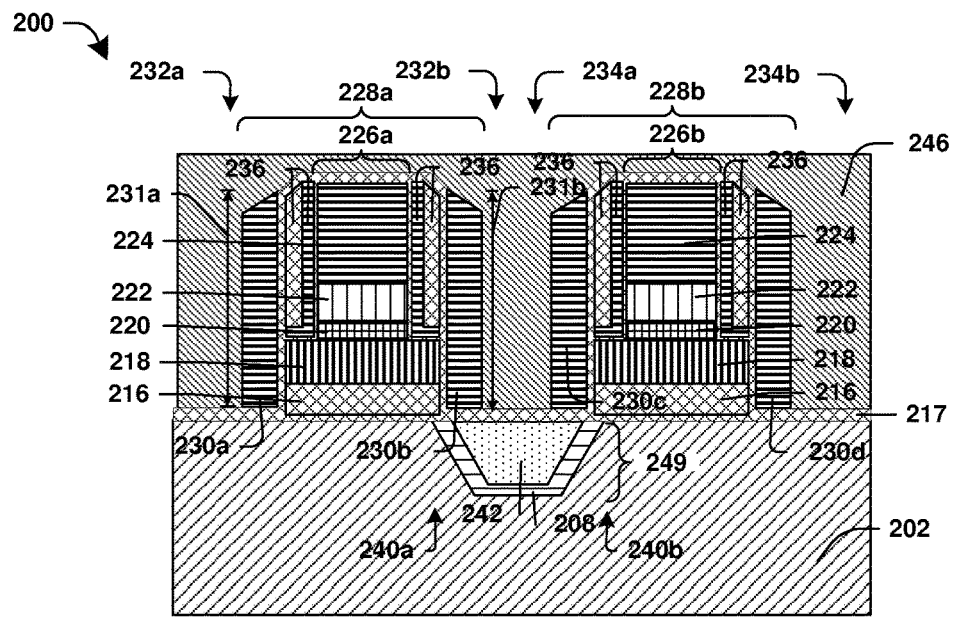
FIG. 21 is an illustration of a semiconductor arrangement, according to some embodiments.
Figure 22:
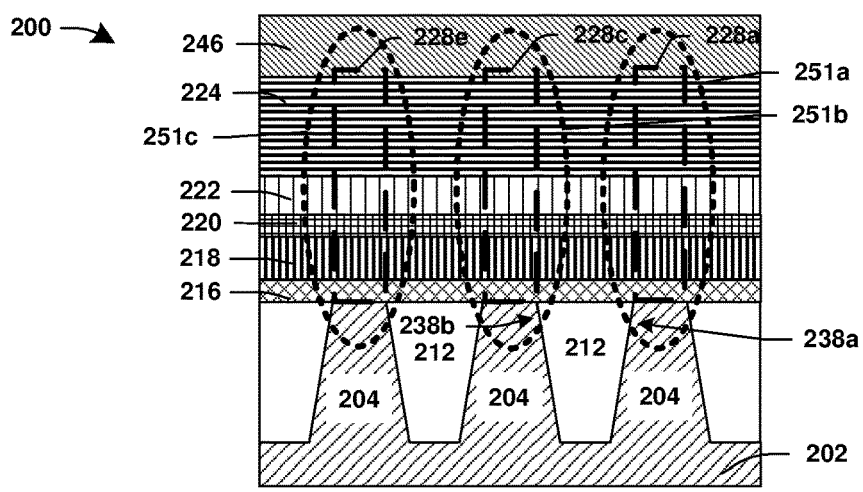
FIG. 22 is an illustration of a semiconductor arrangement, according to some embodiments.
Figure 23:
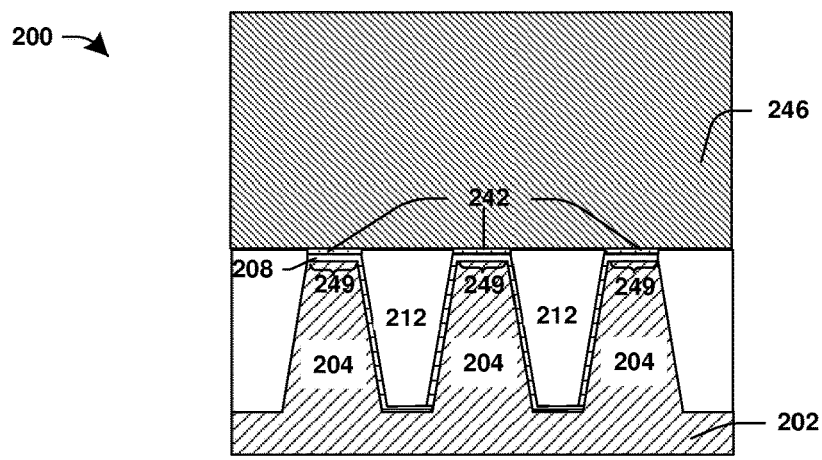
FIG. 23 is an illustration of a semiconductor arrangement, according to some embodiments.

At 110, a shallow implant 242 is formed in top portions 209 of the deep implant 208 that are exposed or not covered by STI 212, as illustrated in FIGS. 18-20. In some embodiments, the STI regions 212 are masked off such that the shallow implant 242 is implanted in the exposed deep implant 208 and not in the STI regions 212. In some embodiments, a second resist 245, such as a photoresist, is formed and patterned over at least part of the first gate structure 228a, the second gate structure 228b, additional gate structures, such as 228c, 228d, 228e, 228f, etc. and STI regions 212. In some embodiments, the shallow implant 242 is formed via shallow implantation 244. In some embodiments, the shallow implantation 244 comprises implanting a dose between about 1E05 atoms/cm$^2$ or less of a first dopant at an energy of between about 0.5 keV to about 4 keV. In some embodiments, the first dopant comprises at least one of nitrogen, phosphorus or arsenic. In some embodiments, the first dopant comprises at least one of boron, aluminum or gallium. In some embodiments, the active area 249 thus comprises the shallow implant 242 and the deep implant 208. In some embodiments, the active area 249 comprises at least one of a source or a drain for a gate structure 228. In some embodiments, at least the first gate structure 228a and the second gate structure 228b share the active area 249. According to some embodiments, the gate structures 228a, 228b, 228c, 228d, 228e, 228f, as well as zero or more additional gate structures share the active area 249, or at least the deep implant 208. According to some embodiments, a dielectric 246 is formed over the gate structures 228 and the STI regions 212. According to some embodiments, the gate structures 228 of resulting transistors 251 share materials of the gate material stack 248 as illustrated in FIGS. 16, 19 and 22. Materials of the gate material stack 248 are thus common among resulting transistors 251, where the transistors 251 are delineated from one another by STI regions 212 which separate OD regions 204 of the transistors 251 from one another. Thus, resulting transistors 251 have different OD regions 204 but common gate structure materials, where the OD regions 204 generally comprise source, drain and channel regions for respective transistors 251.

According to some embodiments, a method of forming a semiconductor arrangement comprises forming a deep implant in a substrate, forming a first gate structure on a first side of the deep implant, forming a second gate structure on a second side of the deep implant, such that the first gate structure and the second gate structure share the deep implant and forming a shallow implant in the deep implant to form an active area.

According to some embodiments, a semiconductor arrangement comprises an active area comprising a deep implant, a first gate structure on a first side of the active area and a second gate structure on a second side of the active area. In some embodiments, the first gate structure and the second gate structure share the active area. In some embodiments, the first gate structure comprises a first gate, a first spacer on a first side of the first gate and a second spacer on a second side of the first gate, the first spacer having a first spacer height and the second spacer having a second spacer height, the first spacer height substantially equal to the second spacer height.

According to some embodiments, a method of forming a semiconductor arrangement comprises forming a deep implant in a substrate, forming a first gate structure on a first side of the deep implant, forming a second gate structure on a second side of the deep implant, forming a third gate structure on the first side of the deep implant and forming a fourth gate structure on the second side of the deep implant such that the first gate structure, the second gate structure, the third gate structure and the fourth gate structure share the deep implant.

Although the subject matter has been described in language specific to structural features or methodological acts, it is to be understood that the subject matter of the appended claims is not necessarily limited to the specific features or acts described above. Rather, the specific features and acts described above are disclosed as embodiment forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor device, comprising:
   a first fin defining a first active area;
   a second fin defining a second active area;
   a first implant region over a top surface of a first portion of the first fin and adjacent a sidewall of the first portion of the first fin;
   a shallow trench isolation region between the first fin and the second fin, wherein the shallow trench isolation region covers a first portion of the first implant region adjacent the sidewall of the first portion of the first fin;
   a second implant region over a second portion of the first implant region over the top surface of the first portion of the first fin;
   a first gate structure over a second portion of the first fin; and
   a second gate structure over a third portion of the first fin, wherein the first portion of the first fin is between the second portion of the first fin and the third portion of the first fin.

2. The semiconductor device of claim 1, wherein:
   a third portion of the first implant region is adjacent a sidewall of a first portion of the second fin, and
   the shallow trench isolation region is laterally between the first portion of the first implant region and the third portion of the first implant region.

3. The semiconductor device of claim 2, wherein:
   a fourth portion of the first implant region extends between the first portion of the first implant region and the third portion of the first implant region, and
   the shallow trench isolation region overlies the fourth portion of the first implant region.

4. The semiconductor device of claim 1, comprising:
   a third implant region over a portion of the second fin, wherein the third implant region is separated from the second implant region by the shallow trench isolation region.

5. The semiconductor device of claim 1, comprising:
   a dielectric layer over the shallow trench isolation region.

6. The semiconductor device of claim 5, wherein the dielectric layer is in contact with the shallow trench isolation region.

7. The semiconductor device of claim 6, wherein the dielectric layer is in contact with the second implant region.

8. The semiconductor device of claim 1, comprising a dielectric layer extending continuously over the first portion of the first fin, the second portion of the first fin, and the third portion of the first fin.

9. The semiconductor device of claim 8, wherein the dielectric layer is under the first gate structure and the second gate structure.

10. A semiconductor device, comprising:
a first fin;
a second fin;
a first implant region over a top surface of a first portion of the first fin and adjacent a sidewall of the first portion of the first fin; and
a shallow trench isolation region, wherein in a first cross-sectional view perpendicular to a longest dimension of the first fin and the second fin, a first portion of the first implant region underlies a bottommost surface of the shallow trench isolation region.

11. The semiconductor device of claim 10, comprising:
a second implant region, wherein in the first cross-sectional view, the second implant region overlies a second portion of the first implant region.

12. The semiconductor device of claim 11, comprising:
a third implant region, wherein, in the first cross-sectional view:
the third implant region overlies a third portion of the first implant region, and
the shallow trench isolation region is between the second implant region and the third implant region.

13. The semiconductor device of claim 10, comprising a gate structure, wherein in a second cross-section view perpendicular to the longest dimension of the first fin and the second fin, the gate structure overlies the first fin and the second fin.

14. The semiconductor device of claim 10, wherein the first implant region extends continuously from the first fin to the second fin.

15. The semiconductor device of claim 10, comprising:
a first gate structure over a second portion of the first fin; and
a second gate structure over a third portion of the first fin, wherein the first portion of the first fin is between the second portion of the first fin and the third portion of the first fin.

16. A semiconductor device, comprising:
a first fin;
a first implant region;
a second implant region;
a first gate structure;
a second gate structure; and
a dielectric layer, wherein in a first cross-sectional view parallel to a longest dimension of the first fin:
the second implant region overlies the first implant region,
the dielectric layer underlies the first gate structure and the second gate structure,
the dielectric layer overlies the second implant region,
the dielectric layer extends under a sidewall spacer of the first gate structure; and
the dielectric layer extends continuously between the first gate structure and the second gate structure.

17. The semiconductor device of claim 16, wherein the first gate structure comprises:
a gate oxide over the dielectric layer;
a floating gate over the gate oxide; and
a control gate over the floating gate.

18. The semiconductor device of claim 16, comprising:
a shallow trench isolation region, wherein in a second cross-sectional view perpendicular to the longest dimension of the first fin, the shallow trench isolation region is adjacent the first fin.

19. The semiconductor device of claim 18, wherein in the second cross-sectional view, the first implant region is between the shallow trench isolation region and the first fin.

20. The semiconductor device of claim 18, wherein in the second cross-sectional view, the first implant region underlies the shallow trench isolation region.

* * * * *